(12) United States Patent
Harada (10) Patent No.: US 7,030,791 B2
(45) Date of Patent: Apr. 18, 2006

(54) A/D CONVERSION DEVICE HAVING INPUT LEVEL SHIFT AND OUTPUT CORRECTION FUNCTION

(75) Inventor: Takuya Harada, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/043,192

(22) Filed: Jan. 27, 2005

(65) Prior Publication Data

US 2005/0168363 A1 Aug. 4, 2005

(30) Foreign Application Priority Data

Jan. 30, 2004 (JP) ............................ 2004-023300

(51) Int. Cl.
*H03M 1/06* (2006.01)
*H03M 1/34* (2006.01)

(52) U.S. Cl. .................... 341/118; 341/120; 341/139; 341/141; 341/155; 341/158

(58) Field of Classification Search ............... 341/118, 341/139, 141
See application file for complete search history.

(56) References Cited

U.S. PATENT DOCUMENTS 4,654,632 A * 3/1987 Yoshida et al. ............. 341/141
5,212,483 A * 5/1993 Wakimoto ................... 341/141

FOREIGN PATENT DOCUMENTS

| JP | A-2001-111424 | 4/2001 |
| JP | A-2001-223586 | 8/2001 |
| JP | A-2003-31415 A | 1/2003 |

* cited by examiner

*Primary Examiner*—Peguy JeanPierre
*Assistant Examiner*—Khai Nguyen
(74) *Attorney, Agent, or Firm*—Posz Law Group, PLC (57) ABSTRACT

In an A/D conversion device, one level shift circuit shifts an input voltage to the low potential side by Vt1, and another level shift circuit shifts the input voltage to the high potential side by Vt2. A multiplexer selects either of the shifted voltages to an A/D converter. In a correction mode, a correction data holding circuit holds values of reference voltages that are also A/D converted after being passed through the one level shift circuit and values of reference voltages that are A/D converted by being passed through the other level shift circuit, as correction values. A correction control circuit corrects the A/D converted value using the correction values.

8 Claims, 7 Drawing Sheets

| S2 | S3 | INPUT V0 | V3 |
|---|---|---|---|
| 1 | 0 | * | V1 |
| * | 1 | * | V2 |
| 0 | 0 | $\geq$ Vh | V1 |
| 0 | 0 | < Vh | V2 |

A/D CONVERSION DEVICE HAVING INPUT LEVEL SHIFT AND OUTPUT CORRECTION FUNCTION

CROSS REFERENCE TO RELATED APPLICATION

This application is based on and incorporates herein by reference Japanese Patent Application No. 2004-23300 filed on Jan. 30, 2004.

FIELD OF THE INVENTION

The present invention relates to an A/D conversion device suitable for both single channel configuration and multi-channel configuration.

BACKGROUND OF THE INVENTION

Figure 9:
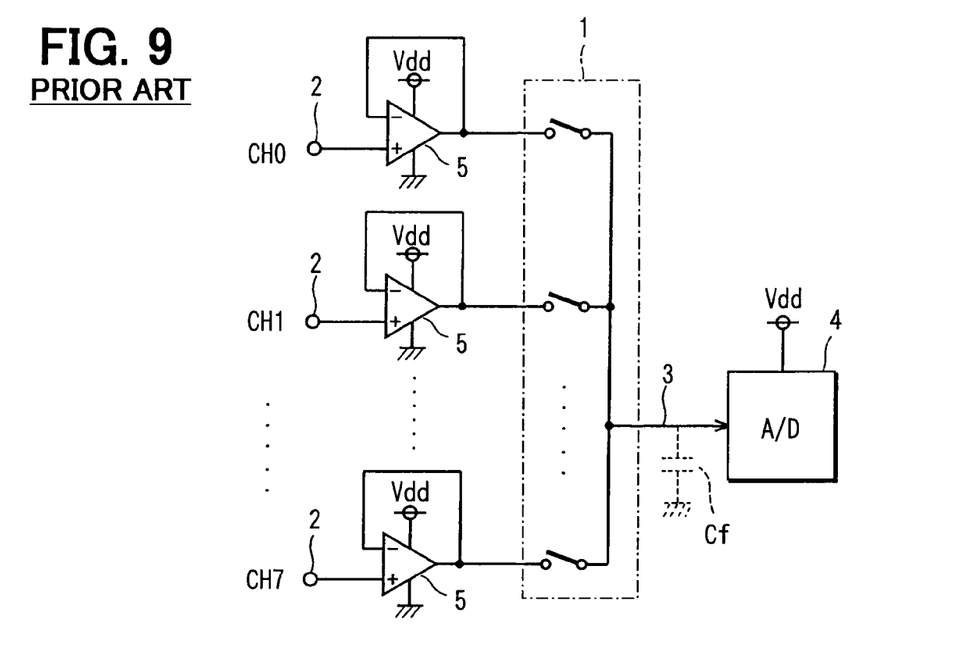
FIG. 9 is an electric block diagram of a conventional multi-channel A/D conversion device.

FIG. 9 shows one example of a multi-channel A/D conversion device, which is so configured that a voltage of each input terminal 2 is selected by an analog multiplexer 1 and the selected input voltage is given to an A/D converter 4 through a common line 3. A parasitic capacitor Cf generally exists in the analog multiplexer 1 as shown by a broken line in the figure. As a result, the input voltage of the channel selected last time remains in the parasitic capacitor Cf, and an A/D conversion error arises due to its effect. Therefore, the input part of each channel is equipped with a buffer amplifier 5.

In the A/D conversion device shown in FIG. 9, a conversion reference voltage Vref of the A/D converter 4 is often set equal to the power supply voltage Vdd. In this case, when the voltage of the input terminal 2 becomes close to either Vdd that is the full scale or 0 V that is a zero point, an offset voltage increases because of a characteristic of the buffer amplifier 5, which produces an A/D conversion error. Moreover, if the voltage of the input terminal 2 exceeds the power supply voltage Vdd or falls below 0 V due to floating ground potential etc., it is impossible to obtain an A/D converted value corresponding to the input voltage.

Figure 10:
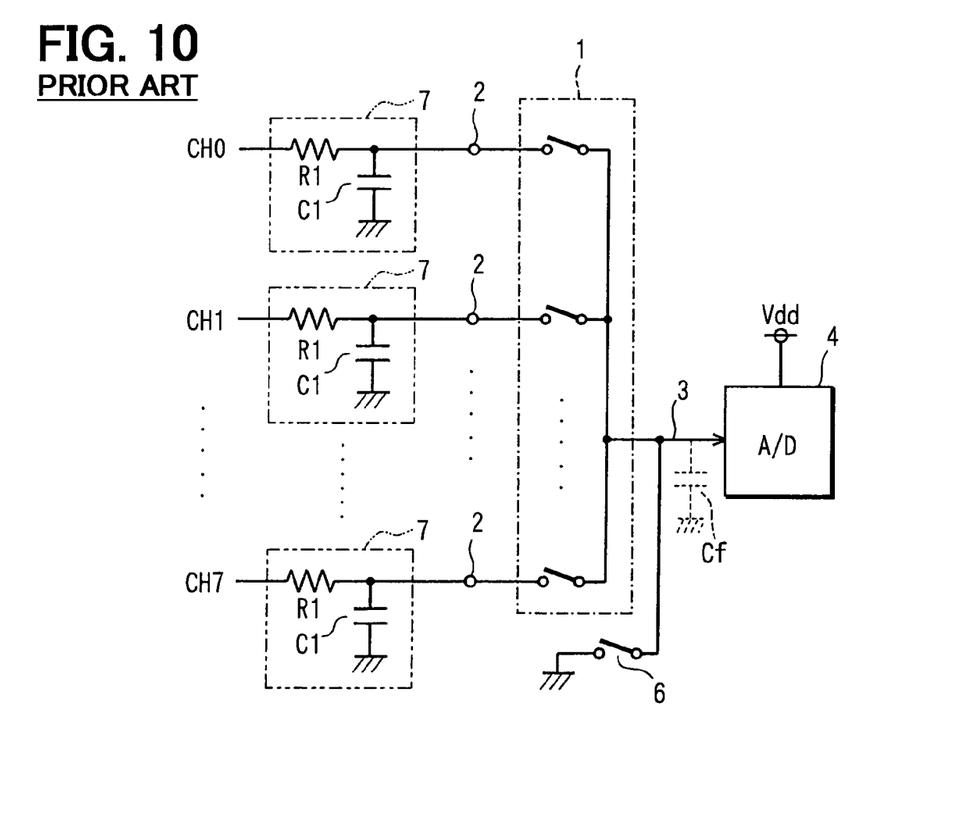
FIG. 10 is an electric block diagram of another conventional multi-channel A/D conversion device.

On the other hand, FIG. 10 shows the configuration of a multi-channel A/D conversion device disclosed in JP 2001-111424A. In this device, the common line 3 is configured to be connectable to the ground line through a switching circuit 6. That is, the A/D conversion device is so configured that the influence of the residual voltage in the capacitor Cf is eliminated by turning on the switching circuit 6 and initializing the common line 3 to discharge the stored charge of the parasitic capacitor Cf.

However, the parasitic capacitor Cf of the analog multiplexer 1 still exists. As a result, a current flows from the input terminal 2 of the selected channel into the parasitic capacitor Cf, which is now at the ground potential, producing an error arising from delay in stabilizing the voltage of the common line 3. Therefore, it is necessary to connect a capacitor C1 having a capacitance sufficiently large to the parasitic capacitor Cf externally to each input terminal 2. This capacitor C1 with a resistor R1 also functions as a filter circuit 7.

In addition, the necessity of setting the electrostatic capacity of the capacitor C1 constituting the filter circuit 7 to a large value will add cost of the filter circuit 7 that is an external part. Further, an area for its installation on a substrate will be enlarged.

JP 2001-223586A discloses another multi-channel A/D conversion device equipped with a holding capacitor in front of an A/D converter. This holding capacitor is charged up to a reference voltage that is set to an intermediate level in the possible voltage range of an analog signal before a sampling circuit starts sampling.

Further, JP 2003-031415A discloses a still another A/D conversion device. In this device, first and second level shift circuits take in terminal voltages of the high and low voltage sides of a current detection resistor, respectively, and output voltages higher than the input voltage by fixed voltages, respectively. The difference of A/D converted values provided by passing them through the respective level shift circuits is detected as a current value. This detected value is corrected.

SUMMARY OF THE INVENTION

The object of the present invention is to provide an A/D conversion device that can reduce a conversion error arising from capacitance components existing in an input line from an input terminal to an A/D converter.

According to the present invention, when a voltage to be converted (conversion object voltage) applied to an input line of an A/D converter is equal to or more than a predetermined threshold, a selection circuit selects a first level shift circuit. This first level shift circuit gives to the A/D converter a voltage that is shifted to the low potential side by a first offset voltage with respect to the conversion object voltage. On the other hand, when the conversion object voltage is less than the predetermined threshold, the selection circuit selects a second level shift circuit. This second level shift circuit gives to the A/D converter a voltage that is shifted to the high potential side by a second offset voltage with respect to the conversion object voltage. The A/D converted value outputted from the A/D converter is corrected according to a selection state of the selection circuit, becoming a final A/D converted value.

Generally, the level shift circuit has a function as an impedance conversion circuit of high input impedance and low output impedance, as well as a function of a level translation circuit, and is typically made up of a source follower circuit. By using the impedance conversion characteristic positively, the input line of the A/D converter in which capacitance components (parasitic capacitor and holding capacitor) exist can be driven with low output impedance, and consequently a settling time of the input voltage of the A/D converter in response to a change in an input signal voltage can be shortened. As a result, a conversion error arising from the capacitance components can be reduced.

By thus reducing the influence of the capacitance components existing in the input line of the A/D converter, it becomes unnecessary to add such a capacitor for eliminating the influence of the capacitance components as was used in the conventional technology. As a result, the A/D conversion device becomes advantageous in reduction of the cost, reduction of the substrate area, etc. However, it may still be necessary to provide a filter circuit including a capacitor is provided to suppress external noises.

Moreover, the conversion object voltage equal to or more than the predetermined threshold is shifted to the low potential side, and the conversion object voltage less than the predetermined threshold is shifted to the high potential side. It is therefore advantageous that the input voltage range of the A/D conversion device is expanded from the input voltage range of the A/D converter itself. As a result, even if the input signal voltage from the outside exceeds the input voltage range of the A/D converter itself due to floating ground potential etc., it is possible to provide the A/D converted value and achieve an effect equivalent to improving resolution of an A/D converter.

Preferably, in the correction mode, reference voltages are applied to the input line and A/D converted. Then, the A/D converted values outputted from the A/D converter are held in the holding circuit as correction values. In the normal mode, the signal voltage from the outside is applied to the input line, and is A/D converted. The A/D converted value outputted from the A/D converter is corrected using the correction values according to the selection state of the selection circuit.

This correction is a process in which the A/D converted value is shifted only by an amount corresponding to the shift voltage of the level shift circuit to rebuild the A/D converted value. Even if the shift voltage of the level shift circuit may vary from product to product, the correction corresponding to the shift voltage is performed for each product, so that a high-accuracy A/D converted value can be provided. If two or more reference voltages are used, even in the case where the shift voltage of the level shift circuit varies depending on the input signal voltage, it becomes possible to correct the shift characteristic. Furthermore, if two or more reference voltages are used, even in the case where the transfer function of the A/D converter is not linear, it becomes possible to correct the nonlinearity.

Preferably, in the correction mode, one or more correction values can be provided in both the input voltage range in which the first level shift circuit is selected and the input voltage range in which the second level shift circuit is selected. For this reason, in the normal mode, whether the conversion object voltage is not less than the predetermined threshold or is less than the predetermined threshold, the A/D converted values can be corrected using at least one correction value.

Preferably, the selection circuit, using the center value of the input voltage range of the A/D converter as the predetermined threshold, selects the output voltage of the first level shift circuit when the conversion object voltage is equal to or more than the predetermined threshold, and selects the output voltage of the second level shift circuit when it is less than the predetermined threshold.

Accordingly, when the shift voltage (shift quantity) of the first level shift circuit and the shift voltage (shift quantity) of the second level shift circuit are almost equal, the input voltage range handled by the first level shift circuit and the input voltage range handled by the second level shift circuit become almost equal. Thus, a well-balanced A/D converter such that the high potential side and the low potential side are symmetric can be configured.

Preferably, in the input voltage range handled by the first level shift circuit, the correction is performed at two points, that is, the maximum value and the center value of the input voltage range of the A/D converter. In the input voltage range handled by the second level shift circuit, the correction is performed at two points, that is, the center value and the minimum value of the input voltage range of the A/D converter. As a result, it becomes possible to correct the shift characteristic of the level shift circuit, and to correct the nonlinearity of the A/D converter, as described above.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

A first embodiment of an A/D conversion device in a single channel configuration will be described referring to FIGS. 1 to 5.

Figure 1:
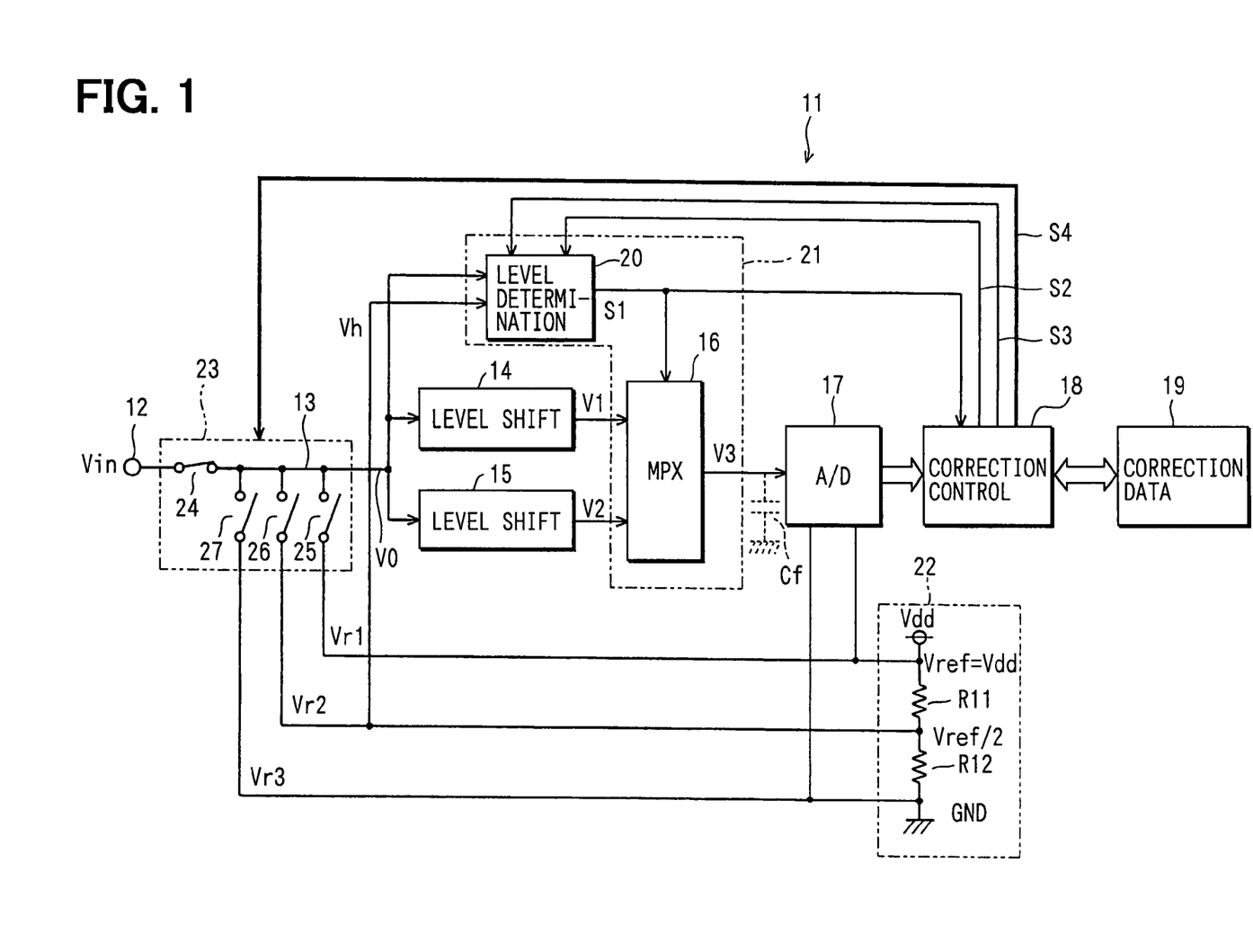
FIG. 1 is an electric block diagram of an A/D conversion device according to a first embodiment of the present invention.

As shown in FIG. 1, an A/D conversion device 11 is constructed as an IC (semiconductor integrated circuit device) that uses the MOS semiconductor manufacture process, and is incorporated as a peripheral of, for example, a one-chip microcomputer. The A/D conversion device 11 has a normal mode, in which a signal voltage Vin inputted from the outside of the IC is A/D converted. It also has a correction mode, in which predetermined reference voltages Vr1, Vr2 and Vr3 are A/D converted to acquire correction values serving as correction references (correction data).

An input terminal 12 through which a signal voltage Vin is inputted from the outside of the IC is connected to two level shift circuits 14, 15 through an input line 13. The level shift circuit 14 shifts an input voltage V0 given to the input line 13 (the signal voltage Vin or the reference voltages Vr1, Vr2 and Vr3) to the low potential side by Vt1 (corresponding to a first offset voltage) and outputs the shifted voltage as V1. The level shift circuit 15 shifts the input voltage V0 to the high potential side by Vt2 (corresponding to a second offset voltage) and outputs the shifted voltage as V2. These level shift circuits 14, 15 are constructed using source follower circuits, respectively, as will be described later.

A multiplexer (MPX) 16 selects either the output voltage V1 of the level shift circuit 14 or the output voltage V2 of the level shift circuit 15 according to a control signal S1, and outputs a selected voltage V3 to an A/D converter 17.

The A/D converter 17 converts the output voltage V3 of the multiplexer 16 to an A/D converted value with predetermined resolution (e.g., eight bits), and outputs it. The A/D converter 17 may operate in any one of the successive comparison system, the parallel system, the series-parallel system, the integration system, the ΔΣ system, etc. The A/D converter 17 operates with the power supply voltage Vdd supplied from the power supply line. A reference voltage Vref defining its input voltage range from 0 to Vref (range [0 to Vref] for simplicity) is set equal to the power supply voltage Vdd.

A correction control circuit 18 is a circuit for performing correction control of the A/D converted value outputted from the A/D converter 17. The correction control circuit 18 is configured to control, in the correction mode, the selection of the reference voltages Vr1, Vr2 and Vr3 using control signals S2, S3 and S4 and the selection of the level shift circuits 14, 15 by the multiplexer 16 and store the correction values that are the A/D converted values in a correction data holding circuit 19. The correction data holding circuit 19 may be a RAM or registers.

On the other hand, the correction control circuit 18 is configured to digitally correct, in the normal mode, the A/D converted value outputted from the A/D converter 17 using the control signal S1 and the correction values stored in the correction data holding circuit 19 in advance to obtain a final A/D converted value (after correction) of the inputted signal voltage Vin. This correction control circuit 18 may be constructed of hardware. However, for example, if a CPU is loaded on the IC, the CPU may perform software processing in place of the hardware.

A level determination circuit 20 constitutes a selection circuit 21 with the multiplexer 16, and outputs the control signal S1 commanding to select either of the level shift circuits 14, 15 to the multiplexer 16. The level determination circuit 20 is configured to perform an operation shown in FIG. 3 according to the control signals S2, S3 outputted from the correction control circuit 18. That is, it outputs the control signal S1 (i.e., 1) commanding to select the level shift circuit 14 to the multiplexer 16 in the case of (S2, S3)=(1, 0), and outputs the control signal S1 (i.e., 0) commanding to select the level shift circuit 15 to the multiplexer 16 in the case of (S2, S3)=(*, 1). Here, "0" represents the L level, "1" the H level, and "*" represents either the L level or the H level.

Figure 3:
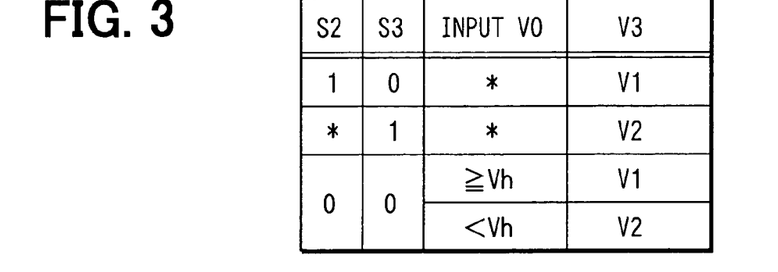
FIG. 3 is a table illustrating a relation between control signals S2, S3 and a selection state of the multiplexer in the first embodiment.

In the case of (S2, S3)=(0, 0), the level determination circuit 20 compares the input voltage V0 and the predetermined threshold voltage Vh, and determines the control signal S1 according to the result of the magnitude comparison. The predetermined threshold voltage Vh is set equal to the center value Vref/2 of the input voltage range [0 to Vref] of the A/D converter 17.

The level determination circuit 20 is configured to operate as follows. When the input voltage V0 is equal to or more than the predetermined threshold voltage Vh, it outputs a control signal S1 commanding to select the level shift circuit 14 (i.e., V1) to the multiplexer 16. When the input voltage V0 is less than the predetermined threshold voltage Vh, it outputs the control signal S1 commanding to select the level shift circuit 15 (i.e., V2) to the multiplexer 16.

A reference voltage generation circuit 22 is for generating the reference voltages Vr1, Vr2 and Vr3 to be used in the correction mode and the predetermined threshold voltage Vh to be used in the normal mode. The reference voltages Vr1, Vr2 and Vr3 are set equal to the maximum value Vref, the center value Vref/2 and the minimum value 0 V of the input voltage range [0 to Vref] of the A/D converter 17, respectively. The power supply voltage Vdd (=Vref) and the ground potential are used for the reference voltages Vr1 and Vr3, respectively. The reference voltage Vr2 and the predetermined threshold voltage Vh are formed by dividing the power supply voltage Vdd by resistors R11 and R12 of equal resistance.

An input switching circuit 23 is constructed with four switching circuits (analog switches) 24–27 whose opening and closing are controlled by the control signal S4 outputted from the correction control circuit 18. The switching circuit 24 is provided on the halfway of the input line 13 from the input terminal 12 to the level shift circuits 14, 15. The switching circuit 25 is provided between a connection node of the switching circuit 24 and the level shift circuits 14, 15 and the power supply line. The switching circuit 26 is provided between the connection node and the potential dividing point of the resistors R11, R12. The switching circuit 27 is provided between the connection node and the ground line.

Figure 2:
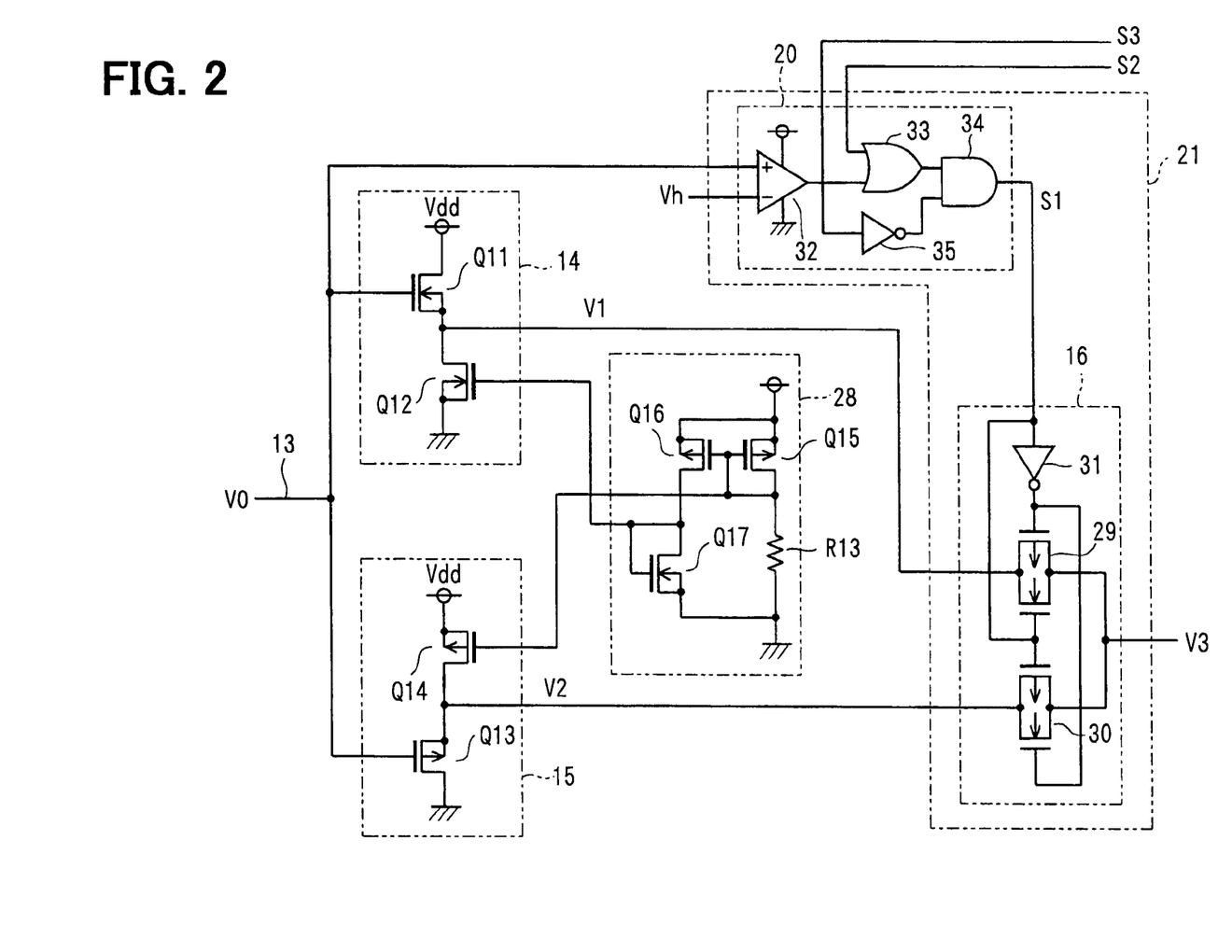
FIG. 2 is a circuit configuration diagram of a level shift circuit, a multiplexer and a level determination circuit in the first embodiment.

Next, referring to FIG. 2, a circuit configuration of the level shift circuits 14, 15, the multiplexer 16, and the level determination circuit 20 will be described. The level shift circuit 14 is a source follower circuit using an N-channel type transistor Q11. The source of the transistor Q11 is connected to the ground line through an N-channel type transistor Q12 operating as a constant current circuit. The gate of the transistor Q11 is connected to the input line 13, and the drain thereof is connected to the power supply line. The shift voltage Vt1 is equal to the gate-source voltage VGS1 of the transistor Q11. Thus, the output voltage V1 of the level shift circuit 14 becomes V0−Vt1.

Similarly, the level shift circuit 15 is a source follower circuit using a P-channel type transistor Q13. The source of the transistor Q13 is connected to the power supply line through a P-channel type transistor Q14 operating as a constant current circuit. The gate of the transistor Q13 is connected to the input line 13, and the drain thereof is connected to the ground line. The shift voltage Vt2 is equal to the gate-source voltage VGS2 of the transistor Q13. Thus, the output voltage V2 of the level shift circuit 15 becomes V0+Vt2.

A constant current generation circuit 28 is for generating a reference constant current used to make the transistors Q12, Q14 operate as constant current circuits. That is, between the power supply line and the ground line, a p-channel type transistor Q15 and a resistor R13, and a P-channel type transistor Q16 and an N-channel type transistor Q17 are connected in series, respectively. The transistors Q15, Q16, and the transistors Q15, Q14 constitute current mirror circuits, respectively. The transistors Q17 and Q12 also constitute a current mirror circuit.

The multiplexer 16 is constructed with an analog switch 29 provided between an output terminal of the level shift circuit 14 (the source of the transistor Q11) and an input terminal of the A/D converter 17, an analog switch 30 provided between an output terminal of the level shift circuit 15 (the source of the transistor Q13) and the input terminal of the A/D converter 17, and an inverter 31. The control signal S1 from the level determination circuit 20 is given to the analog switches 29, 30 directly or through the inverter 31. When the control signal S1 is unity ("1"), the analog switch 29 is turned on and the analog switch 30 is turned off. When the control signal S1 is zero ("0"), the analog switch 29 is turned off and the analog switch 30 is turned on.

The level determination circuit 20 is equipped with a comparator 32 for comparing the voltage V0 of the input line 13 and the predetermined threshold voltage Vh. An output signal of the comparator 32 is inputted into an AND gate 34 through an OR gate 33. The control signal S2 is inputted into the other input terminal of the OR gate 33, and the control signal S3 is inputted into the other input terminal of the AND gate 34 through an inverter 35.

The operation of this embodiment will be described referring to FIGS. 4 and 5.

The A/D conversion device 11 is switched to the correction mode when the power is supplied, or at predetermined intervals after that, or when needed. In this correction mode, the switching circuit 24 is turned off, and the reference voltages Vr1, Vr2 and Vr3 are A/D converted serially to acquire the correction values (corrected data). After completing acquisition of the correction values, the A/D conversion device 11 shifts to the normal mode, becoming capable of A/D converting the signal voltage Vin from the outside of the IC.

First, the operation of the correction mode will now be described.

In the correction mode, the correction control circuit 18 turns off the switching circuit 24, and turns on only the switching circuit 25 among the switching circuits 25–27. As a result, the reference signal Vr1, i.e., Vref, is applied to the input line 13. Then, the control signals (S2, S3) are set to (1, 0), and consequently the multiplexer 16 is made to select the output voltage V1 of the level shift circuit 14. In this switched state, the input voltage V3 of the A/D converter 17 becomes Vref−Vt1. The A/D converter 17 A/D converts this voltage, and the correction control circuit 18 stores the A/D converted value ADL1(Vref) in the correction data holding circuit 19.

Subsequently, the correction control circuit 18 turns on only the switching circuit 26 among the switching circuits 25–27, with the switching circuit 24 turned off. As a result, the reference signal Vr2, i.e., Vref/2, is applied to the input line 13. The control signals (S2, S3) maintain (1, 0), respectively. In this switched state, the input voltage V3 of the A/D converter 17 becomes Vref/2−Vt1. The A/D converter 17 A/D converts this voltage, and the correction control circuit 18 stores the A/D converted value ADL1(Vref/2) in the correction data holding circuit 19.

Then, the correction control circuit 18 sets the control signals (S2, S3) to either (0, 1) or (1, 1), while keeping the state of the switching circuits 24–27. The multiplexer 16 is made to select the output voltage V2 of the level shift circuit 15. In this switched state, the input voltage V3 of the A/D converter 17 becomes Vref/2+Vt2. The A/D converter 17 A/D converts this voltage, and the correction control circuit 18 stores the A/D converted value ADL2(Vref/2) in the correction data holding circuit 19.

Moreover, the correction control circuit 18 turns on only the switching circuit 27 among the switching circuits 25–27, with the switching circuit 24 turned off. As a result, the reference signal Vr3, i.e., 0 V, is applied to the input line 13. The control signals (S2, S3) maintain either (0, 1) or (1, 1). In this switched state, the input voltage V3 of the A/D converter 17 becomes Vt2. The A/D converter 17 A/D converts this voltage, and the correction control circuit 18 stores the A/D converted value ADL2(0) in the correction data holding circuit 19.

Figure 4:
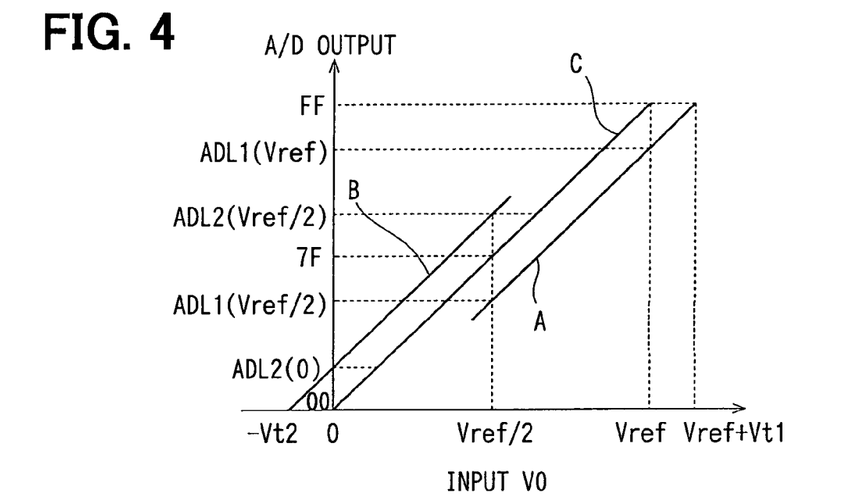
FIG. 4 is a graph illustrating a characteristic of an A/D converted value (before correction) as a function of an input voltage V0 in the first embodiment.

FIG. 4 shows the characteristic of the A/D converted value (before correction) as a function of the input voltage V0. It is assumed that the A/D converter 17 has a resolution of eight bits, and its transfer function is linear. The horizontal axis of the figure represents the input voltage V0, and the vertical axis represents the A/D converted value (before correction). The straight line C in the figure indicates the conversion characteristic of the A/D converter 17 itself.

The straight line A indicates the conversion characteristic when the level shift circuit 14 is selected, and the straight line B indicates the conversion characteristic when the level shift circuit 15 is selected. The A/D converted values ADL1(Vref) and ADL1(Vref/2) are defined by the straight lines A and C, respectively, and the A/D converted values ADL2(Vref/2) and ADL2(0) are defined by the straight lines B and C, respectively.

That is, the correction values ADL1(Vref) and ADL1(Vref/2) show the correspondence between the input voltage V0 and the A/D converted value (before correction) when the level shift circuit 14 is selected. The correction values ADL2(Vref/2) and ADL2(0) show the correspondence between the input voltage V0 and the A/D converted value (before correction) when the level shift circuit 15 is selected.

The correction values signify not only correction information representing the shift voltages Vt1, Vt2 of the level shift circuits 14, 15 but also correction information representing the voltage dependence of the shift voltages Vt1, Vt2 on the input voltage V0 and the conversion characteristic (nonlinearity) of the A/D converter 17 that will be found by obtaining the correction values at two points for each of the level shift circuits 14, 15.

The operation of the normal mode will be described.

When the A/D conversion device 11 is placed in the normal mode, generally the correction control circuit 18 turns on the switching circuit 24 and turns off all of the other switching circuits 25–27. As s result, the signal voltage Vin is applied to the input line 13 from the outside through the input terminal 12. At the same time, the control signals (S2, S3) are set to (0, 0). In this embodiment, the predetermined threshold voltage Vh is set equal to Vref/2.

The multiplexer 16 selects the output voltage V1 of the level shift circuit 14 when the input voltage V0 is equal to or more than Vref/2, and selects the output voltage V2 of the level shift circuit 14 when the input voltage V0 is less than Vref/2. By this voltage shift control, the input voltage range of the signal voltage Vin is expanded to a range [−Vt2 to Vref+Vt1] from the range [0 to Vref] of the A/D converter 17 itself.

Figure 5:
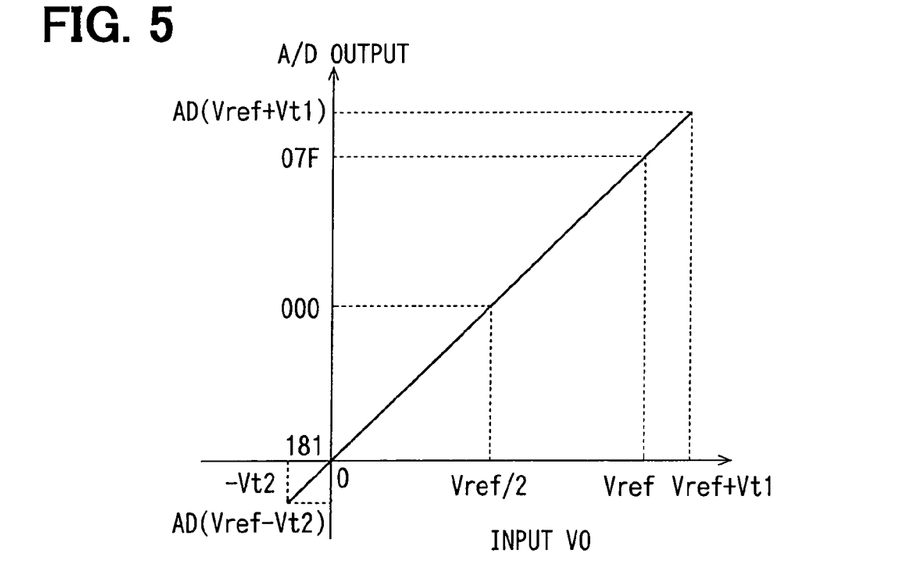
FIG. 5 is a graph illustrating a characteristic of an A/D converted value (after correction) as a function of an input voltage V0 in the first embodiment.

FIG. 5 shows a characteristic of the A/D converted value (after correction) as a function of the input voltage V0 after the correction has been performed by the correction control circuit 18. Since the input voltage range is expanded, the A/D converted values (after correction) is expressed with 9-bits by expansion of 1-bit using a complement number of "2" such that 000H is assigned as the A/D converted value (after correction) when the input voltage V0 is equal to Vref/2. The voltage shift control does not reduce resolution. It assigns 07FH as the A/D converted value (after correction) when the input voltage V0 is equal to Vref, and assigns 181H as the A/D converted value (after correction) when the input voltage V0 is equal to 0 V.

The correction control circuit 18 recognizes the selection of the level shift circuits 14, 15 based on the control signal S1 outputted from the level determination circuit 20. When the input voltage V0 is in the range [Vref/2 to Vref+Vt1] and hence the level shift circuit 14 is being selected, digital correction processing is performed using the correction values ADL1(Vref) and ADL1(Vref/2). That is, when the A/D converted value outputted from the A/D converter 17 is ADL1(Vref), the A/D converted value (after correction) is set to 07FH. When it is ADL1(Vref/2), the A/D converted value (after correction) is set to 000H. For other A/D converted values, the A/D converted values (after correction) are provided by performing interpolation with a linear function.

Similarly, when the input voltage V0 is in the range [−Vt2 to Vref/2] and hence the level shift circuit 15 is selected, digital correction processing is performed using the correction values ADL2(Vref/2) and ADL2(0). That is, when the A/D converted value outputted from the A/D converter 17 is ADL2(Vref/2), the A/D converted value (after correction) is set to 000H. When it is ADL2(0), the A/D converted value (after correction) is set to 181H. For other A/D converted values, the A/D converted values (after correction) are provided by processing interpolation with a linear function.

As a result of this correction control, when the transfer function of the A/D converter 17 is linear, the A/D converted value (after correction) based on the linear conversion characteristic is provided in the input voltage range [−Vt2 to Vref+Vt1].

As described above, in the A/D conversion device 11 of this embodiment, when the signal voltage Vin is equal to or more than the predetermined threshold voltage Vh, the signal voltage Vin is shifted to the low potential side and inputted into the A/D converter 17. When the signal voltage Vin is less than the predetermined threshold voltage Vh, the signal voltage Vin is shifted to the high potential side and inputted into the A/D converter 17. Thus, the input voltage range of the signal voltage Vin can be expanded to the range [−Vt2 to Vref+Vt1].

Although the voltage value for one LSB is the same as that of the conventional configuration, the effect equivalent to substantially increasing resolution of the A/D converter can be achieved because the input voltage range was expanded. As a result of this, even if the signal voltage Vin exceeds the input voltage range [0 to Vref] of the A/D converter 17 itself due to, e.g., floating ground potential etc., the A/D converted value can be provided.

Each of the level shift circuits 14, 15 is made up of a source follower circuit consisting of the transistor Q11 (Q13). Since the source follower circuit has a characteristic of high input impedance and low output impedance as an impedance conversion circuit, it has a high capability of driving the input lines (parasitic capacitor Cf being distributed) from the level shift circuits 14, 15 to the A/D converter 17 through the multiplexer 16. That is, it brings the same effect as that when the buffer amplifier (FIG. 9) is provided.

Therefore, even when the signal voltage Vin changes abruptly, the settling time of the input voltage V3 of the A/D converter 17 becomes short and hence the conversion error due to the parasitic capacitor Cf can be reduced. Moreover, it becomes unnecessary to add the capacitor (FIG. 10) for eliminating the influence of the parasitic capacitor Cf that has been used in the conventional device, and the cost and the area of the substrate can be reduced. In addition, any problem related to the offset voltage close to the power supply voltage or 0 V does not arise when using the buffer amplifier.

The A/D conversion device is so configured that, in the correction mode prior to the normal mode or in the correction mode entered in process of the normal mode, the A/D converted values each provided with one of the reference voltages Vr1, Vr2 and Vr3 being set to the input voltage V0 are held as the correction values. In the normal mode, the A/D converted value outputted from the A/D converter 17 is corrected using the correction values. By this scheme, even if the shift voltages Vt1, Vt2 of the level shift circuits 14, 15 may vary from product to product, a high-accuracy A/D converted value (after correction) can be provided because the shift voltages Vt1, Vt2 are corrected by the correction control.

The correction values are provided both in the input voltage range [Vref/2 to Vref+Vt1] handled by the level shift circuit 14 and in the input voltage range [−Vt2 to Vref/2] handled by the level shift circuit 15 using the reference voltages at both ends or near at both ends thereof, respectively. Therefore, linear approximation is used to correct the voltage dependency of the shift voltages Vt1 and Vt2 on the input voltage V0, as well as the typical shift voltages Vt1 (typ), Vt2 (typ) of the level shift circuits 14, 15.

The predetermined threshold voltage Vh used by the level determination circuit 20 is set equal to the center value Vref/2 of the input voltage range [0 to Vref] of the A/D converter 17, and the shift voltage Vt1 is nearly equal to the shift voltage Vt2. Therefore, the input voltage range handled by the level shift circuit 14 becomes almost equal to the input voltage range handled by the level shift circuit 15, and hence the A/D convert 11 whose high potential side and low potential side are well-balanced symmetrically can be made up.

(Second Embodiment)

Figure 6:
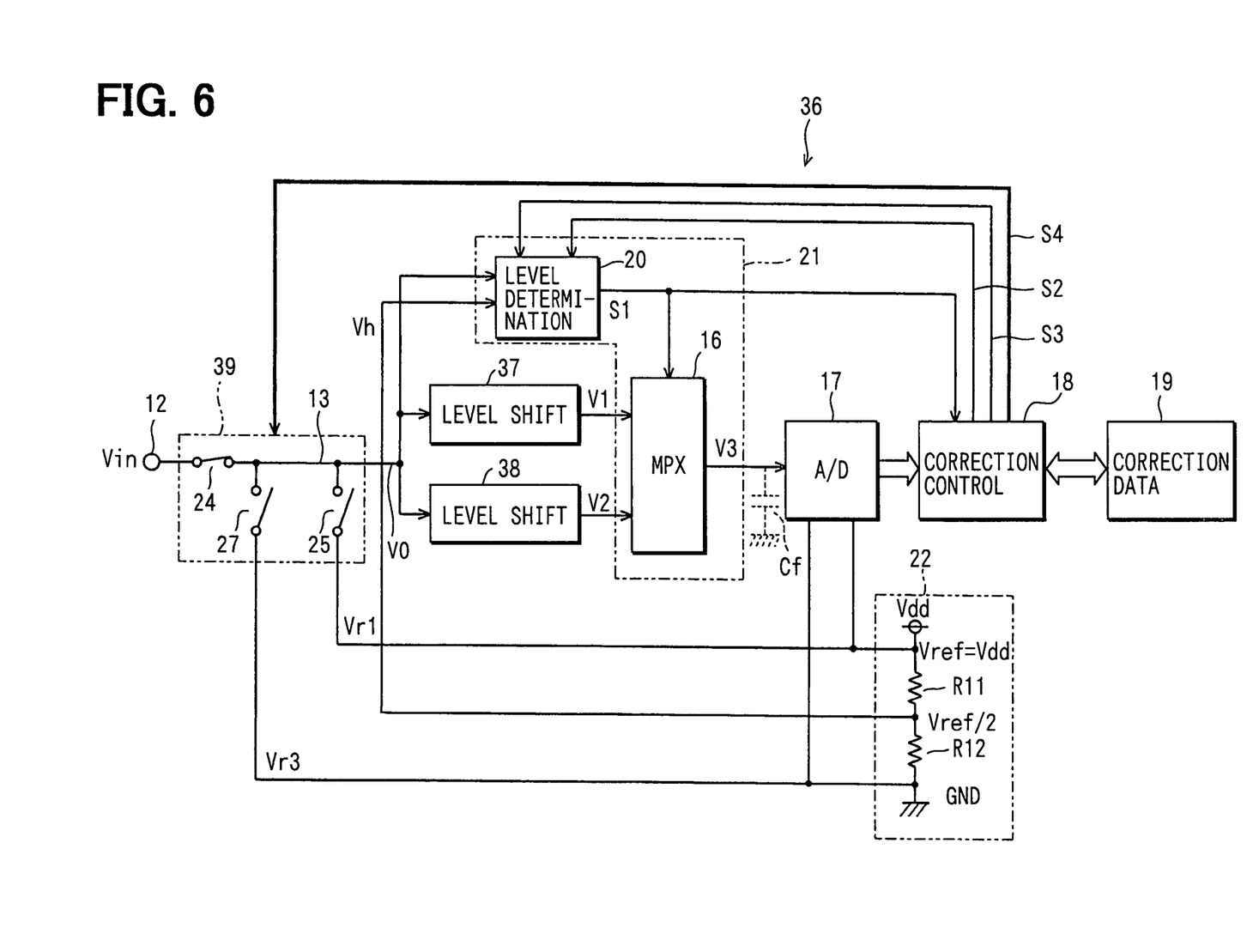
FIG. 6 is an electric block diagram of an A/D conversion device according to a second embodiment of the present invention.

FIG. 6 shows an A/D conversion device 36 according to the second embodiment. This A/D conversion device 36 differs from the A/D conversion device 11 shown in FIG. 1 in the configuration of level shift circuits 37, 38. In this embodiment, the acquisition of the correction values using the reference voltage Vr2 (=Vref/2) becomes unnecessary in the correction mode. Accordingly, an input switching circuit 39 is not equipped with the switching circuit 26 of the first embodiment.

Figure 7:
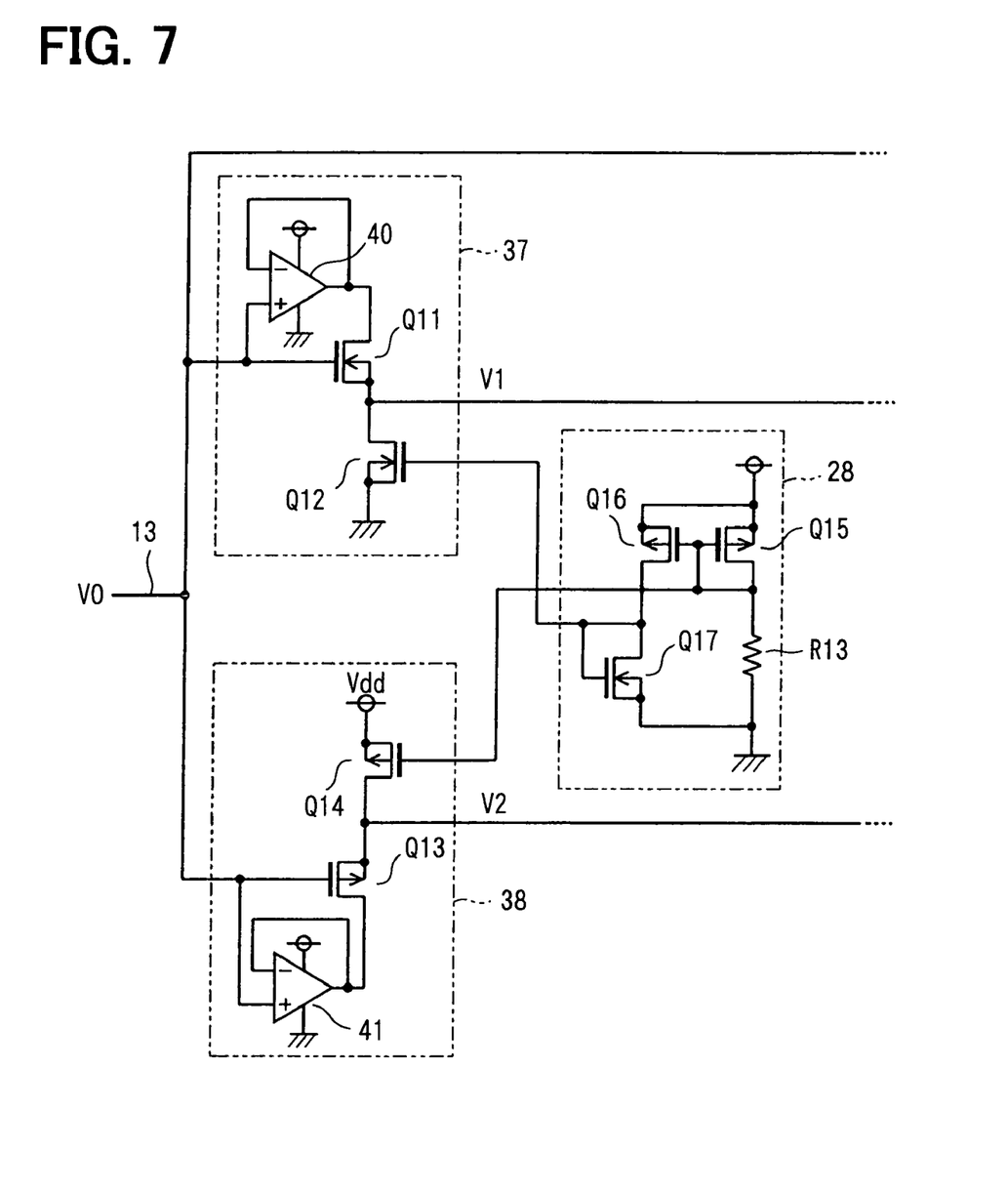
FIG. 7 is a circuit configuration diagram of a level shift circuit in the second embodiment.

FIG. 7 shows a circuit configuration of the level shift circuits 37, 38. The gate and the drain of the level shift circuit 37 are coupled through an operational amplifier 40 having a connection mode of a voltage follower. The gate and the drain of the level shift circuit 38 are coupled through an operational amplifier 41 having a connection mode of a voltage follower. The rest of the configuration is the same as that of the level shift circuits 14, 15 of the first embodiment.

According to this configuration, since voltages between the drains and the sources of the transistors Q11, Q13 can be maintained constant, respectively, voltages between the gates and the sources of the respective transistors Q11, Q13, namely, the shift voltages Vt1, Vt2 can be fixed regardless of the magnitude of the input voltage V0.

As a result, as long as the transfer function of the A/D converter 17 is linear, once the correction value ADL1(Vref) at the reference voltage Vr1 is provided in the input voltage range [Vref/2 to Vref+Vt1] handled by the level shift circuit 37 and the correction value ADL2(0) at the reference voltage 0 V is provided in the input voltage range [−Vt2 to Vref/2] handled by the level shift circuit 38, the correction becomes possible for any input voltage V0 other than Vr1 and 0 V. Therefore, according to this second embodiment, acquisition processing of the correction values in the correction mode becomes easier.

(Third Embodiment)

Figure 8:
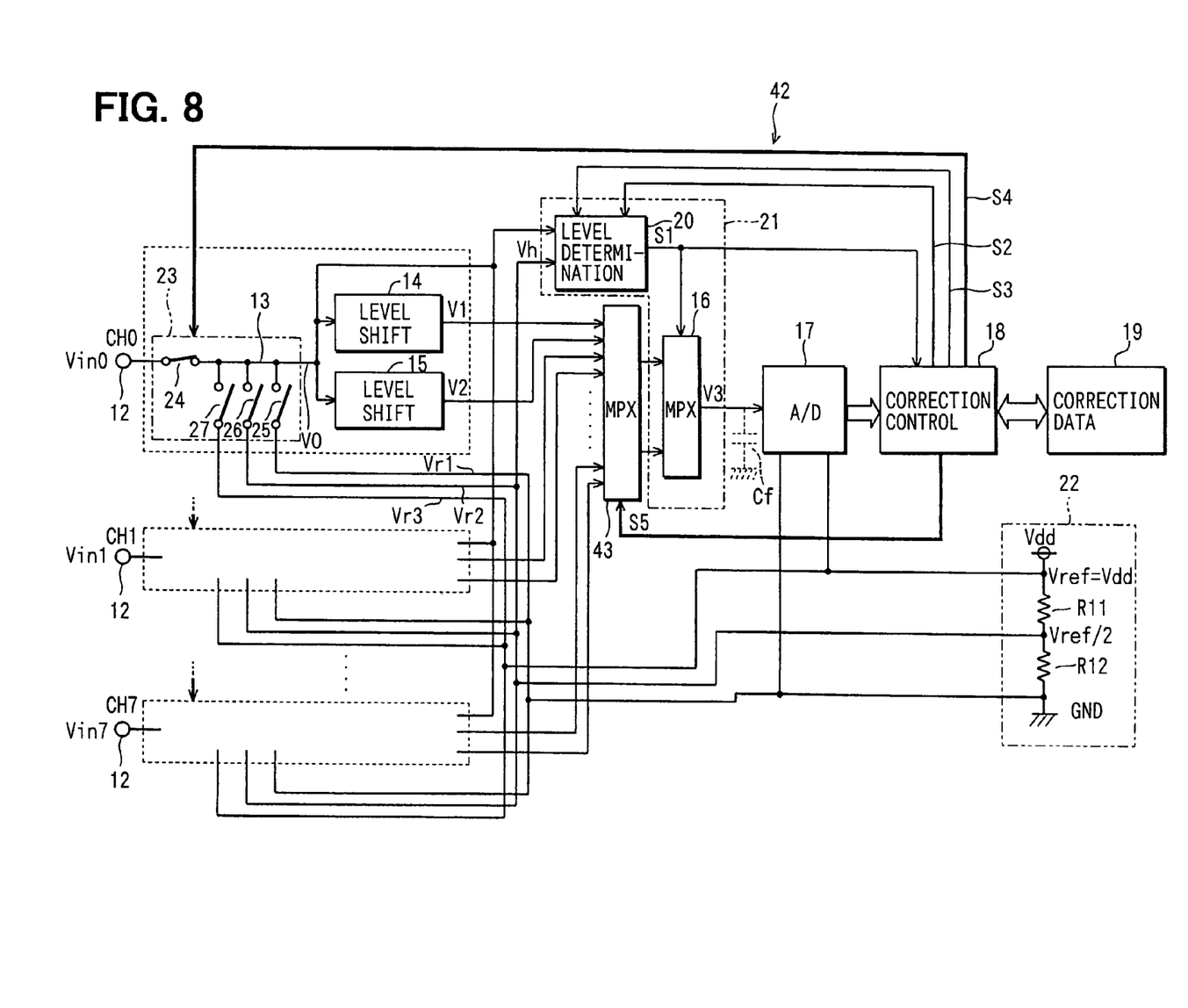
FIG. 8 is an electric block diagram of an A/D conversion device according to a third embodiment of the present invention.

An A/D converter circuit device 42 according to a third embodiment is constructed in a multi-channel configuration as shown in FIG. 8.

This A/D conversion device 42 is similar to the A/D conversion device 11 of the first embodiment, but the number of channels is increased to eight. Each of channel 0 through channel 7 needs the input terminal 12, the input switching circuit 23, and the level shift circuits 14, 15. In the figure, portions surrounded by broken lines are of the same configuration, so the whole configuration is shown therein with channel 1 through channel 7 omitted.

Between the level shift circuits 14, 15 and the multiplexer 16 of each channel, a multiplexer 43 is provided for selecting output voltages V1, V2 of the level shift circuits 14, 15 of any one of the channels. This multiplexer 43 is so configured that switching thereof is controlled by a control signal S5 outputted from the correction control circuit 18.

Like the A/D conversion device 11 of the first embodiment, this A/D conversion device 42 is switched to the correction mode when the power is supplied, or at predetermined intervals after that, or when needed. In this correction mode, the correction values are acquired for channel 0 through channel 7 sequentially.

The method for acquiring the correction values of each channel is the same as that of the A/D conversion device 11 in a single channel configuration of the first embodiment. Consequently, the correction data holding circuit 19 stores the correction values ADL1(Vref), ADL1(Vref/2), ADL2 (Vref/2) and ADL2(0) for channel 0 through channel 7, respectively. It is not necessary to acquire correction values for channels that are not in use.

After completing the acquisition of the correction values, the A/D conversion device 42 shifts to the normal mode, becoming capable of A/D converting signal voltages Vin0 to Vin7 inputted into respective channels from the outside of the IC. At the time of A/D conversion of each channel, correction processing is performed using the correction values ADL1(Vref), ADL1(Vref/2), ADL2(Vref/2) and ADL2(0) acquired for that channel. The method of the correction processing is the same as that of the A/D conversion device 11.

Since the A/D conversion device 42 of this third embodiment is in a multi-channel configuration, the parasitic capacitor Cf distributed along the input line from the level shift circuits 14, 15 to the A/D converter 17 of each channel through the multiplexers 43, 16 becomes large. However, since each pair of the level shift circuits 14, 15 is constructed with the source follower circuits, the input line can be driven with low output impedance and hence the A/D conversion error arising from the parasitic capacitor Cf can be reduced. In addition, it has the same operations and effects as the first embodiment.

(Other Embodiments)

The present invention is not limited to the disclosed embodiments, and can be modified or expanded as follows.

In each embodiment, no external capacitors shown in FIG. 10 is provided for eliminating the influence of the parasitic capacitors Cf of the input lines. However, it is possible to use such external filtering capacitors for reducing external noises.

In the present invention, acquisition control of the correction values in the correction mode and the circuit configuration therefor (input switching circuit 23 etc.) are not necessarily required. In the case where the shift voltages Vt1, Vt2 of the level shift circuits 14, 15, 37 and 38 are provided with high accuracy in the manufacture, the correction values can be provided in advance. Therefore, these correction values may be stored permanently in the correction control circuit 18 or the correction data holding circuit 19 to be used to perform correction processing in the normal mode. In this case, a plurality of correction values may be used appropriately according to the input voltage V0.

In the first and third embodiments, two correction values are acquired in each of the input voltage range handled by the level shift circuit 14 and the input voltage range handled by the level shift circuit 15. However, a configuration in which the reference voltages are increased in number and more correction values are provided may be employed. With such a scheme, even if the shift voltages Vt1, Vt2 of the level shift circuits 14, 15 have nonlinear characteristics to the input voltage V0, or even if the transfer function of the A/D converter 17 has nonlinearity, an A/D converted value of the further higher accuracy (after correction) can be acquired.

In the second embodiment, a configuration in which the switching circuit 26 is provided to obtain the correction values ADL2(Vref/2) and ADL2(0) for the reference voltage Vr2 and the correction is performed in the same way as the first embodiment may be employed. As described above, a configuration in which the reference voltages are increased in number and more correction values are provided may be employed. By this modification, even if the transfer function of the A/D converter 17 has nonlinearity, an A/D converted value of the further higher accuracy (after correction) can be provided.

In the case where a plurality of reference voltages are used to perform the correction, a preferable embodiment will become one in which these reference voltages are set at almost equal intervals in the input voltage ranges handled by the level shift circuits 14, 15, 37 and 38, respectively.

The predetermined threshold voltage Vh may be a different voltage other than the center value Vref/2 of the input voltage range [0 to Vref] of the A/D converter 17.

In the third embodiment, the A/D conversion device may be in a multi-channel configuration using the A/D conversion device 36 of the second embodiment.

The present invention is also suitable for a circuit to which a holding capacitor (capacitance component) is added.

What is claimed is:

1. An A/D conversion device comprising:
   an input line for receiving a conversion object voltage;
   a first level shift circuit that shifts the conversion object voltage applied to the input line to a first object voltage, which is on a low potential side by a first offset voltage;
   a second level shift circuit that shifts the conversion object voltage applied to the input line to a second object voltage, which is on a high potential side by a second offset voltage;
   a selection circuit that selects the first object voltage outputted from the first level shift circuit when the conversion object voltage is equal to or more than a predetermined threshold, and selects the second object voltage outputted from the second level shift circuit when the conversion object voltage is less than the predetermined threshold;
   an A/D converter that takes in the voltage selected by the selection circuit and A/D converts it in a predetermined voltage range; and
   correcting means for correcting an A/D converted value outputted from the A/D converter according to a selection state of the selection circuit.

2. The A/D conversion device according to the claim 1, further comprising:
   a reference voltage generation circuit for generating reference voltages;
   an input switching circuit for switching an input voltage path so that either a signal voltage inputted from the input terminal or the reference voltage is applied to the input line; and
   a holding circuit for holding the A/D converted value outputted from the A/D converter as a correction value in a correction mode in which the reference voltages are considered as the conversion object voltage and A/D converted,
   wherein the correcting means corrects the A/D converted value outputted from the A/D converter using the correction value held in the holding circuit in a normal mode in which the signal voltage inputted from the input terminal is considered as the conversion object voltage and A/D converted.

3. The A/D conversion device according to claim 2, wherein:
the reference voltage generation circuit generates one or more reference voltages both in a range of voltages equal to or more than a predetermined threshold and in a range of voltages less than the predetermined threshold, respectively; and
the input switching circuit applies any of the reference voltages to the input line selectively in the correction mode.

4. The A/D conversion device according to claim 3, wherein the selection circuit uses a center value of the input voltage range of the A/D converter as the predetermined threshold.

5. The A/D conversion device according to claim 4, wherein:
the reference voltage generation circuit generates the reference voltages that are equal to a maximum value, the center value and a minimum value in the input voltage range of the A/D converter, receptively;
the selection circuit, in the correction mode, selects the first object voltage outputted from the first level shift circuit when both the reference voltage equal to the maximum value and the reference voltage equal to the center value are specified as the conversion object voltages, and selects the second object voltage outputted from the second level shift circuit when both the reference voltage equal to the center value and the reference voltage equal to the minimum value are specified as the conversion object voltages.

6. The A/D conversion device according to claim 1, wherein each of the first and second level shift circuits is made up of a source follower circuit.

7. The A/D conversion device according to claim 1, wherein the source follower circuit includes:
a transistor having a gate to which the conversion object voltage is applied; and
an operational amplifier provided between the gate and a drain of the transistor and has a connection form of a voltage follower.

8. An A/D conversion device comprising:
a plurality of input lines for receiving conversion object voltages, respectively;
a plurality of first level shift circuits provided in correspondence with the input lines, the first level shift circuits shifting the conversion object voltages applied to the input lines to first object voltages, which are on a low potential side by a first offset voltage, respectively;
a plurality of second level shift circuits provided in correspondence with the input lines, the second level shift circuits shifting the conversion object voltages applied to the input lines to second object voltages, which are on a high potential side by a second offset voltage, respectively;
a multiplexer that outputs one of the first object voltages and one of the second object voltages corresponding to one of the conversion object voltages of a specified one of the input lines;
a selection circuit that selects the one of the first object voltages outputted from the one of the first level shift circuits when the one of the conversion object voltages is equal to or more than a predetermined threshold, and selects the one of the second object voltages outputted from the one of the second level shift circuits when the one of the conversion object voltages is less than the predetermined threshold;
an A/D converter that takes in the voltage selected by the selection circuit and A/D converts it in a predetermined voltage range; and
correcting means for correcting an A/D converted value outputted from the A/D converter according to a selection state of the selection circuit.

* * * * *